(12) United States Patent
Choi et al.

(10) Patent No.: US 12,520,711 B2
(45) Date of Patent: Jan. 6, 2026

(54) DISPLAY DEVICE

(71) Applicant: LG Display Co., Ltd., Seoul (KR)

(72) Inventors: Pyungho Choi, Seoul (KR); Hyunseok Na, Hwaseong-si (KR); Hyoungsun Park, Seoul (KR); Hyunchyol Shin, Seoul (KR); Seongsoo Cho, Seoul (KR)

(73) Assignee: LG Display Co., Ltd., Seoul (KR)

( * ) Notice: Subject to any disclaimer, the term of this patent is extended or adjusted under 35 U.S.C. 154(b) by 391 days.

(21) Appl. No.: 18/336,629

(22) Filed: Jun. 16, 2023

(65) Prior Publication Data

US 2023/0413658 A1    Dec. 21, 2023

(30) Foreign Application Priority Data

Jun. 16, 2022  (KR) .......................... 10-2022-0073403

(51) Int. Cl.
| | | |
|---|---|---|
| *H10K 77/10* | (2023.01) | |
| *H10K 59/121* | (2023.01) | |
| *H10K 59/127* | (2023.01) | |
| *H10K 59/131* | (2023.01) | |
| *H10K 59/80* | (2023.01) | |

(52) U.S. Cl.
CPC ....... *H10K 77/111* (2023.02); *H10K 59/1213* (2023.02); *H10K 59/1216* (2023.02); *H10K 59/127* (2023.02); *H10K 59/131* (2023.02); *H10K 59/873* (2023.02)

(58) Field of Classification Search
CPC ............. H10K 77/111; H10K 59/1213; H10K 59/1216; H10K 59/127; H10K 59/131; H10K 59/873; H10K 59/124; H10K 59/122; H10K 59/123; H10K 59/126;
(Continued)

(56) References Cited

U.S. PATENT DOCUMENTS

| | | | |
|---|---|---|---|
| 8,957,411 B2 * | 2/2015 | Yamazaki | .......... H10D 30/6755 |
| | | | 257/E29.296 |
| 11,699,762 B2 * | 7/2023 | Yamazaki | .............. H10D 86/60 |
| | | | 257/43 |

(Continued)

FOREIGN PATENT DOCUMENTS

| | | |
|---|---|---|
| KR | 10-2315554 B1 | 4/2019 |
| KR | 10-2020-0061797 A | 6/2020 |

(Continued)

*Primary Examiner* — Dao H Nguyen
(74) *Attorney, Agent, or Firm* — Seed Intellectual Property Law Group LLP

(57) ABSTRACT

Provided is a display device. The display device comprises a first flexible substrate, a second flexible substrate including a first area, a second area, and a third area, and an intermediate layer between the first flexible substrate and the second flexible substrate. A plurality of pixels is disposed in the first area, and the plurality of pixels includes a first transistor including a polycrystalline semiconductor and a first gate electrode, a second transistor including an oxide semiconductor and a second gate electrode composed of a first metal layer, a second metal layer, and a third metal layer, and a third transistor including the polycrystalline semiconductor disposed in the second area, and a plurality of dams, a first line, a second line, and a cathode are disposed in the third area, and the cathode extends to the first area and the second area.

23 Claims, 6 Drawing Sheets

(58) Field of Classification Search
CPC ............. H10K 2102/311; H10K 50/81; H10K 50/822; H10K 50/8445
See application file for complete search history.

(56) References Cited

U.S. PATENT DOCUMENTS

| | | | |
|---|---|---|---|
| 11,710,794 B2* | 7/2023 | Sato | H01L 21/30604 257/43 |
| 2008/0136990 A1* | 6/2008 | Kimura | G02F 1/1362 349/114 |
| 2008/0225061 A1* | 9/2008 | Kimura | G09G 3/3233 345/690 |
| 2016/0329392 A1* | 11/2016 | Miyake | H10D 30/6734 |
| 2022/0271112 A1* | 8/2022 | Kim | H10D 86/60 |
| 2024/0379062 A1* | 11/2024 | Huang | H10K 59/1201 |
| 2025/0151569 A1* | 5/2025 | Isa | H10K 71/80 |

FOREIGN PATENT DOCUMENTS

| | | |
|---|---|---|
| KR | 10-2021-0004356 A | 1/2021 |
| KR | 10-2021-0004795 A | 1/2021 |
| KR | 10-20210086342 A | 7/2021 |

\* cited by examiner

DISPLAY DEVICE

CROSS-REFERENCE TO RELATED APPLICATIONS

This application claims the priority of Korean Patent Application No. 10-2022-0073403 filed on Jun. 16, 2022, in the Korean Intellectual Property Office, the disclosure of which is incorporated herein by reference.

BACKGROUND

Technical Field

The present disclosure relates to a display device, and more particularly, to a display device including a plurality of thin film transistors by which reliability of elements of the display device can be improved.

Description of the Related Art

Recent display devices which can display various information and interact with a user who views the corresponding information have various sizes, various shapes, and various functions.

The display devices include a liquid crystal display device (LCD), an electrophoretic display device (FPD), and a light-emitting diode display device (LED).

Since the LED as a self-luminous display device does not require an additional light source unlike the LCD, the LED can be manufactured to be light and thin. Further, the LED is driven with low voltage to be advantageous in terms of power consumption and excellent even in color expression, response speed, viewing angle, and contrast ratio (CR). Thus, the LED has been under research as a next-generation display.

If the LED is an organic light-emitting diode display device (OLED), a light-emitting diode layer may be an organic light-emitting diode layer including an anode, an emission layer, and a cathode. Also, as the light-emitting diode layer, a quantum dot light-emitting diode (QLED) including quantum dots (QD) may be used. Hereinafter, even though the description will be made under the assumption that the LED is the OLED, the type of the light-emitting diode layer is not limited thereto.

The OLED displays information on a screen by allowing a plurality of pixels to emit light. The plurality of pixels includes the light-emitting diode layer having the emission layer. The OLED may be classified into an active matrix type organic light-emitting diode display (AMOLED) or a passive matrix type organic light-emitting diode display (PMOLED) according to a scheme to drive the pixels.

The AMOLED displays an image by controlling a current which flows on an organic light-emitting diode by using a thin film transistor (or "TFT").

The AMOLED may include various TFTs including a switching TFT, a driving TFT connected to the switching TFT, and an organic light-emitting diode (OLED) connected to the driving TFT.

A plurality of driving circuits for controlling an operation of the light-emitting diode layer may be disposed in a display area of a substrate. The light-emitting diode layer may be electrically connected to the driving circuits. The driving circuits may supply the light-emitting diode layer with a driving current corresponding to a data signal in response to a scan signal. For example, the plurality of driving circuits may include a plurality of TFTs and a plurality of storage capacitors.

In the plurality of TFTs, different types of semiconductor patterns or hybrid TFTs may be disposed. The different types of semiconductor patters may include, for example, a polycrystalline semiconductor pattern made of low temperature poly-silicon (LTPS) and an oxide semiconductor pattern made of an oxide material.

BRIEF SUMMARY

The inventors have realized that a channel region of the oxide semiconductor may be made conductive at undesired times due to hydrogen permeating from the outside. Therefore, characteristics of elements may be degraded.

The present disclosure provides a display device which includes different types of semiconductor patterns and stably secures characteristics of elements of a transistor including an oxide semiconductor.

According to an aspect of the present disclosure, the display device includes a first flexible substrate and a second flexible substrate including a first area, a second area, and a third area. Also, the display device includes an intermediate layer disposed between the first flexible substrate and the second flexible substrate. A plurality of pixels is disposed in the first area. The plurality of pixels includes a first transistor including a polycrystalline semiconductor and a first gate electrode. Also, the plurality of pixels includes a second transistor including an oxide semiconductor and a second gate electrode composed of a first metal layer, a second metal layer, and a third metal layer. A third transistor including a polycrystalline semiconductor is disposed in the second area. A plurality of dams, a first line, a second line, and a cathode are disposed in the third area, and the cathode extends to the first area and the second area.

Other detailed matters of the example embodiments are included in the detailed description and the drawings.

According to the present disclosure, a display device includes different types of thin film transistors and secures stability of a transistor including an oxide semiconductor and thus improves display quality.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
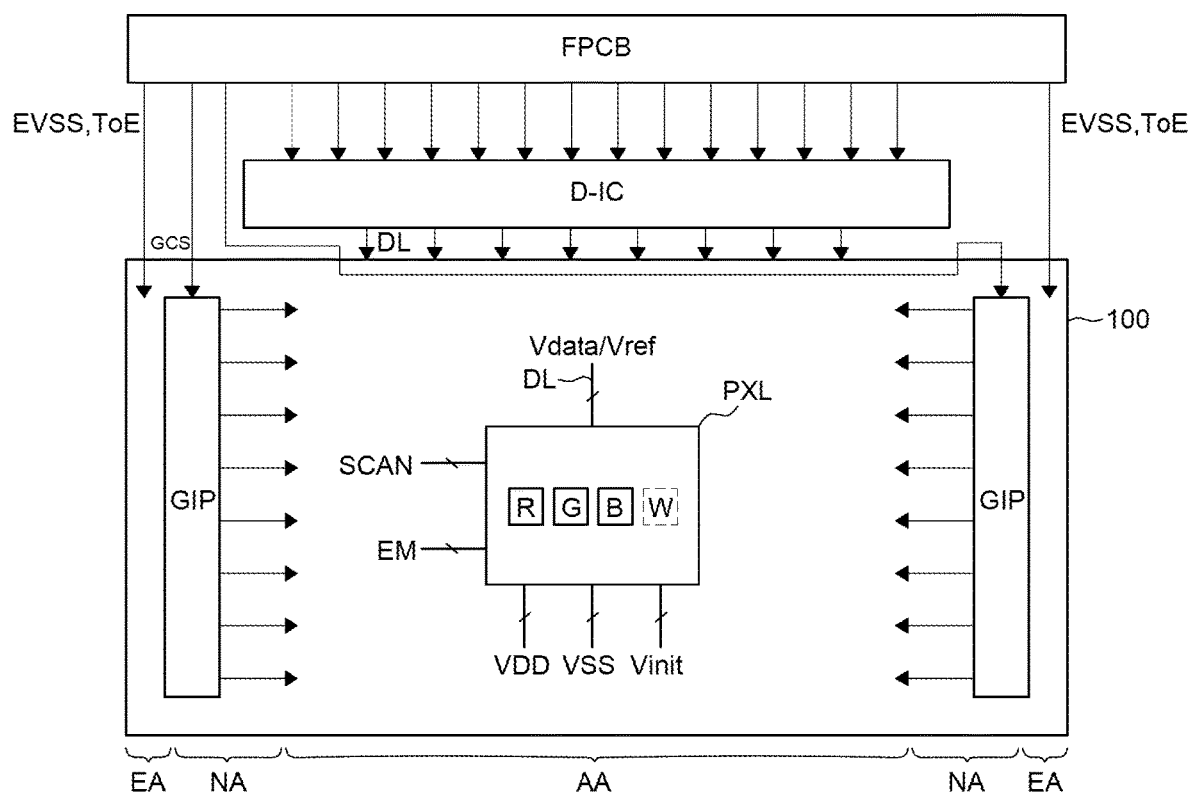
FIG. 1 is a block diagram of a display device according to an embodiment of the present disclosure.

Technical features, benefits and characteristics of the present disclosure and a method of achieving the technical features, benefits, and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

In the description of a temporal relationship, for example, when a temporal relationship between two time points is described by using terms "after," "following," "next to," "before," and the like, the two time points may not be continuous when terms "immediately," or "directly" is not used.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

In describing components of the present disclosure, terms such as first, second, A, B, (a), (b), etc., can be used. These terms are used only to differentiate the components from other components. Therefore, the nature, order, sequence, or number of the corresponding components is not limited by these terms. It is to be understood that when one component is referred to as being "connected to" or "coupled to" another component, it may be directly connected to or directly coupled to another component, connected to or coupled to another component, having still another component "intervening" therebetween, or "connected to" or "coupled to" another component via still another component.

The term "at least one" should be understood as including all possible combinations which can be suggested from one or more relevant components. For example, the meaning of "at least one of a first component, a second component, and a third component" may be each one of the first component, the second component, or the third component and also be all possible combinations which can be suggested from two or more of the first component, the second component, and the third component.

In the present disclosure, the term "device" is used to refer to a display device, such as a liquid crystal module (LCM) and an OLED module, including a display panel and a driver for driving the display panel. Also, the term "device" may include equipment apparatuses including complete products or final products of LCM and OLED modules, for example, a notebook computer, a television, a computer monitor, an automotive apparatus, or other type apparatuses for vehicles, and set electronic apparatuses or set devices such as mobile electronic apparatuses, for example, a smart phone and a tablet.

Therefore, the display of the present disclosure may include a display device itself, such as an LCM or OLED module, and a set device which is an application product or final consumer device equipped with an LCM or OLED module.

In some embodiments, an LCM or OLED module including a display panel, a drive, and the like may be referred to as a "display device". Also, an electronic device as a complete product including an LCM or OLED module may be referred to as a "set device" to be distinguished from the display device. For example, the display device may include an LCD panel or an OLED panel and a source PCB that is a controller for driving the display panel. The set device may further include a set PCB that is a set controller electrically connected to a source PCB so as to control the entire set device.

The display panel used in embodiments of the present disclosure may be any type of display panel, such as an LCD panel, an organic light-emitting diode (OLED) display panel, and an electroluminescent display panel. However, the present disclosure is not limited thereto. For example, the display panel may be a display panel capable of generating sound through vibration caused by a vibration generation device according to embodiments of the present disclosure. There is no limitation to a shape or size of a display panel applied to the display device according to embodiments of the present disclosure.

The features of various embodiments of the present disclosure can be partially or entirely adhered to or combined with each other and can be interlocked and operated in technically various ways, and the embodiments can be carried out independently of or in association with each other.

Hereinafter, embodiments of the present disclosure will be discussed in detail with reference to accompanying drawings. Scale of the components shown in the accompanying drawings is illustrated for convenience of description and may be different from actual scale. Thus, embodiments of the present disclosure are not limited to the scale shown in the drawings.

Hereinafter, various embodiments of the present disclosure will be described in detail with reference to the accompanying drawings.

FIG. 1 is a block diagram of a display device according to an embodiment of the present disclosure.

A display device 10 may include a plurality of areas. For example, the display device 10 includes at least one first area AA serving as a display area where an image is displayed. A pixel array is formed inside the first area AA. At least second area NA serving as a non-display area may be provided outside the first area AA. For example, the second area NA may be adjacent to at least one side surface of the first area AA.

A third area EA may be disposed outside the second area NA. The third area EA may be an edge portion of the display device 10.

Referring to FIG. 1, the second area NA may surround the first area AA having a rectangular shape, and the third area EA may be located outside the second area NA. However, it should be appreciated that the shape of the first area AA and the arrangement of the second areas NA adjacent to the first area AA are not limited to the example of the display device 10 illustrated in FIG. 1. The first area AA and the second area NA may have any shape suitable for the display device 10. Non-limiting examples of the shapes may include a pentagonal shape, a hexagonal shape, a circular shape and an oval shape. However, the present disclosure is not limited thereto.

Each pixel PXL in the first area AA may be associated with a pixel circuit which includes at least one TFT fabricated on a substrate of the display device 10. Each pixel circuit may be electrically connected to a gate line GL and a data line DL to communicate with at least one driving circuit, such as a gate driver GIP and a data driver D-IC located in the second area NA of the display device 10.

The at least one driving circuit may be implemented with TFTs fabricated in the second area NA as illustrated in FIG. 1. For example, the gate driver GIP may be implemented with a plurality of TFTs on the substrate of the display device 10. Non-limiting examples of the circuits that can be implemented with TFTs on the substrate may include an inverter circuit, a multiplexer, an electro static discharge (ESD) circuit, and the like. However, the present disclosure is not limited thereto.

Some driving circuits may be provided as an integrated circuit (IC), or may be mounted in the second area NA of the display device 10 using a chip-on-glass (COG) or other similar methods. Also, some driving circuits may be mounted on another substrate. Alternatively or additionally, some driving circuits may be coupled to a connection interface (pads/bumps, pins) disposed in the second area NA using a printed circuit, such as flexible printed circuit board (PCB), chip-on-film (COF), tape-carrier-package (TCP) or any other suitable technologies.

In the embodiments of the present disclosure, at least two different types of TFTs are used in a TFT substrate for display. The type of TFTs employed in a part of the pixel circuit and a part of the driving circuit may vary depending on the requirements of the display.

For example, the pixel circuit may be implemented with a TFT having an oxide active layer and a TFT having a poly-Si active layer (LTPS TFT), whereas the driving circuit may be implemented with LTPS TFTs. Unlike LTPS TFTs, oxide TFTs do not suffer from the pixel-to-pixel threshold voltage (Vth) variation issue that arises from the formation over the large area. Accordingly, uniform Vth can be obtained in the array of pixel circuits even for a large sized display. The Vth uniformity issue among the TFTs implementing the driving circuit is less likely to have a direct affect in the luminance uniformity of the pixels.

For the driving circuits (e.g., GIP), desired factors may include capability for providing scan signals at higher speed and/or the size of the driving circuit for reducing the size of the bezel.

With the driving circuits on the substrate implemented with LTPS TFTs, signals and data may be provided to the pixels at a higher clock than a case where all of TFTs in a TFT panel are implemented with oxide TFTs. Accordingly, a display capable of high speed operation can be provided without mura. For example, advantages of an oxide TFT and an LTPS TFT are combined in the design of the TFT panel.

Referring to FIG. 1, a low-potential voltage EVSS, a touch signal ToE, and a gate control signal GCS output from a flexible printed circuit board (FPCB) are applied to the panel. Also, a high-potential voltage is applied to the panel through the data driver D-IC.

The gate driver GIP may be provided with a SCAN circuit that is connected to a switching transistor ST1 of the pixel PXL and transfers a signal to turn on/off the switching transistor ST1. Also, the gate driver GIP may be provided with an EM circuit that is connected to an emission signal line EM of the pixel PXL.

Figure 2:
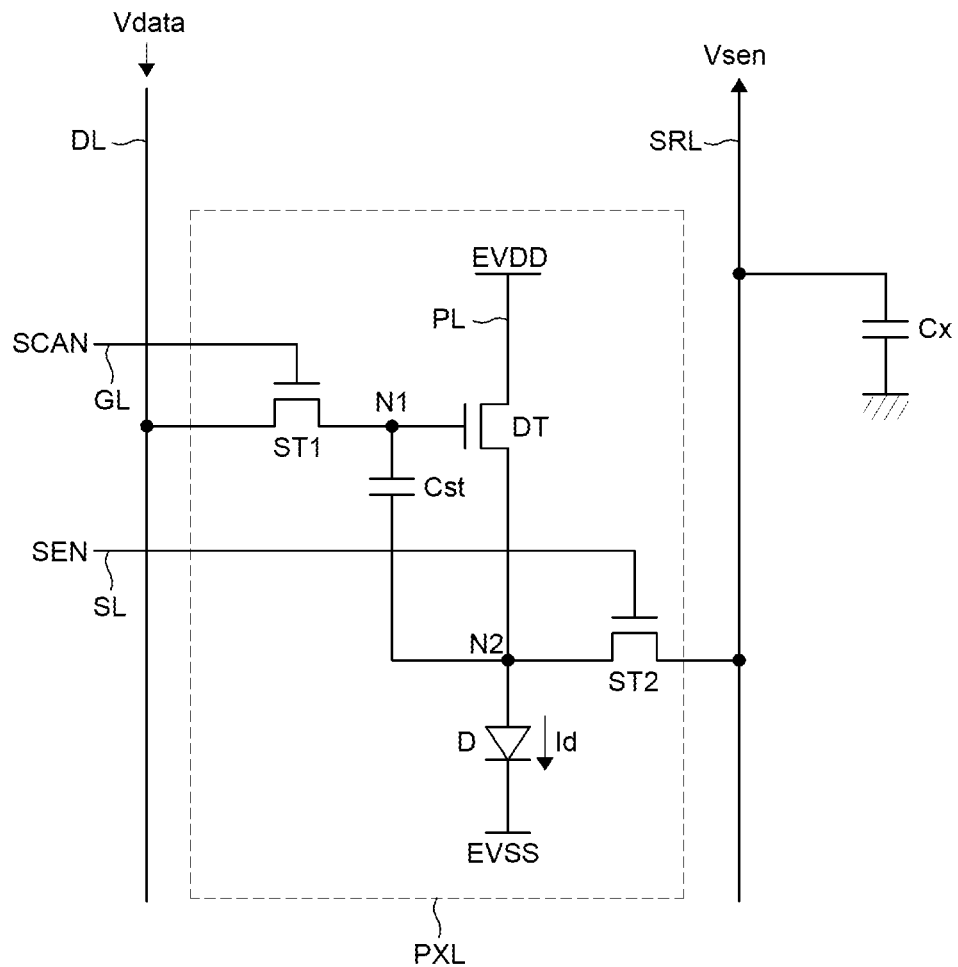
FIG. 2 is a schematic block diagram of a sub-pixel in the display device according to an embodiment of the present disclosure.

FIG. 2 illustrates a pixel circuit that can be used in the embodiments of the present disclosure. FIG. 2 illustrates a display device having a 3T1C structure including three TFTs and one storage capacitor. However, the display device of the present disclosure is not limited thereto, and may have various structures such as 4T1C, 5T1C, 6T1C, 7T1C, 8T1C, 4T2C, 5T2C, 6T2C, 7T2C, and 8T2C.

Referring to FIG. 2, the display device according to an embodiment of the present disclosure includes the gate line GL, the data line DL, a power supply line PL, and a sensing line SL. Each sub-pixel SP may include a first switching TFT ST1, a second switching TFT ST2, the second switching TFT ST2, a driving TFT DT, a light-emitting diode (LED) D, and a storage capacitor Cst. However, the present disclosure is not limited thereto.

The LED D includes an anode connected to a second node N2, a cathode connected to an input terminal of a low-potential driving voltage EVSS, and a light-emitting diode layer located between the anode and the cathode. The LED D may be an organic light-emitting diode (OLED), but the present disclosure is not limited thereto.

The driving TFT DT may control a current Id flowing on the OLED D depending on a gate-source voltage Vgs. The driving TFT DT may include a gate electrode connected to a first node N1, a drain electrode connected to the power supply line PL and supplied with a high-potential driving voltage EVDD, and a source electrode connected to the second node N2.

The storage capacitor Cst is connected between the first node N1 and the second node N2. The storage capacitor Cst serves to maintain a predetermined voltage for one frame.

The first switching TFT ST1 applies a data voltage Vdata charged to the data line DL to the first node N1 in response to a gate signal SCAN during operation of a display panel PAN to turn on the driving TFT DT. Here, the first switching TFT ST1 may include a gate electrode connected to the gate line GL and supplied with the gate signal SCAN. Also, the first switching TFT ST1 may include a drain electrode connected to the data line DL and supplied with the data voltage Vdata and a source electrode connected to the first node N1.

The second switching TFT ST2 switches a current between the second node N2 and a sensing voltage readout line SRL in response to a sensing signal SEN. This is to store a source voltage of the second node N2 in a sensing capacitor Cx of the sensing voltage readout line SRL. The second switching TFT ST2 switches the current between the second node N2 and the sensing voltage readout line SRL in response to the sensing signal SEN during operation of the display panel PAN. This is to reset a source voltage of the driving TFT DT to an initial voltage Vpre. Here, a gate electrode of the second switching TFT ST2 is connected to the sensing line SL, a drain electrode is connected to the second node N2, and a source electrode is connected to the sensing voltage readout line SRL.

Figure 3:
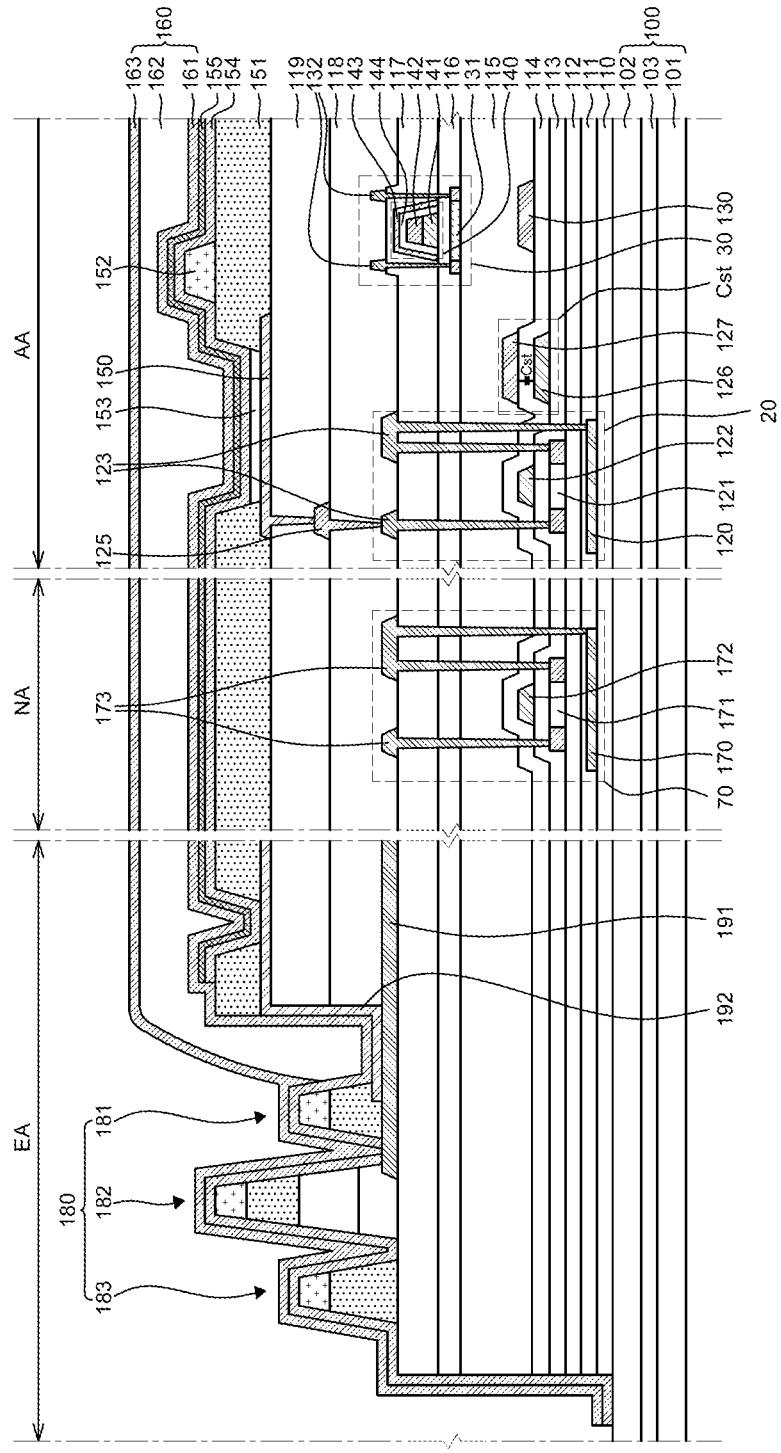
FIG. 3 is a cross-sectional view of the display device according to an embodiment of the present disclosure.

FIG. 3 is a cross-sectional view of the display device according to an embodiment of the present disclosure.

The display device 10 according to an embodiment of the present disclosure is formed on a substrate, e.g., a flexible substrate. The substrate is composed of a first flexible substrate 101, a second flexible substrate 102, and an intermediate layer 103 between the first substrate 101 and the second substrate 102.

The first substrate 101 and the second substrate 102 may be made of at least one of polyimide, polyethersulfone, polyethylene terephthalate and polycarbonate. However, the present disclosure is not limited thereto. If the substrate is made of a plastic material, a display device manufacturing process is performed in a state where a support substrate made of glass is disposed under the substrate. After the display device manufacturing process is completed, the support substrate may be released. Also, after the support substrate is released, a back plate (or plate) for supporting the substrate may be disposed under the substrate. If the substrate is made of a plastic material, moisture may permeate into the TFT or the light-emitting diode layer through the substrate, which causes degradation in performance of the display device. The display device according to an embodiment of the present disclosure may include two substrates, i.e., the first substrate 101 and the second substrate 102, made of a plastic material to suppress degradation in performance of the display device caused by permeation of moisture. Also, the intermediate layer 103, which is an inorganic film, is disposed between the first substrate 101 and the second substrate 102 to suppress permeation of moisture into the substrate. Thus, reliability in performance of a product can be improved. The intermediate layer 103 may be an inorganic film. For example, the intermediate layer 103 may be a single layer of silicon nitride (SiNx) or silicon oxide (SiOx) or a plurality of layers thereof, but is not limited thereto.

The display device formed on a substrate 100 may include a plurality of areas the flexible substrate 100. In an example implementation as shown in the present disclosure, the plurality of areas include a first area AA, a second area NA and a third area EA, but the disclosure is not limited thereto.

A first buffer layer 110 may be disposed on the substrate 100 in the first area AA, the second area NA and the third area EA. The buffer layer 110 may serve to enhance an adhesive force between layers formed on the buffer layer 110 and the substrate 100 and to block alkali elements discharged from the first substrate 101 and the second substrate 102. Also, the buffer layer 110 may serve to suppress various kinds of defects. Further, the buffer layer 110 may delay diffusion of moisture or oxygen permeating into the first substrate 101 and the second substrate 102.

The buffer layer 110 may be a single layer of silicon nitride (SiNx) or silicon oxide (SiOx) or a plurality of layers thereof. If the buffer layer 110 is composed of a plurality of layers, silicon oxide (SiOx) and silicon nitride (SiNx) may be formed alternately.

The buffer layer 110 may be omitted based on a kind and a material of the substrate 100, a structure and a type of the TFT, and the like.

Transistors of the first area AA and the second area NA are formed on the buffer layer 110. The transistors of the first area AA include a first transistor 20 and a second transistor 30 which are switching transistors or driving transistors for driving the pixel PXL. Also, the transistor of the second area NA may include a third transistor 70 for driving the gate driver GIP.

A first blocking layer 120 may be disposed on the buffer layer 110 in the first area AA and the second area NA. The first blocking layer 120 may be greater in size than a semiconductor pattern to be formed later.

The first blocking layer 120 may block light incident from the outside of the display device into the semiconductor pattern to suppress a malfunction of the semiconductor pattern.

The first blocking layer 120 may suppress an inflow of charges from the substrate. For example, if a voltage is applied to a gate electrode of a TFT for a long time, charges of the substrate flow into a channel region of the semiconductor pattern of the transistor due to an electric field E generated in the transistor. Thus, the amount of charges in the channel region may be changed (back channel phenomenon). The charges may be holes or electrons depending on the polarity of the electric field. The substrate may cause a change in threshold voltage of the TFT by changing a current of the TFT. This may cause a change in luminance of the pixel and an afterimage. Therefore, the blocking layer is disposed between the substrate and the semiconductor pattern to block an unwanted inflow of charges from the substrate to the transistor. Accordingly, it is possible to suppress a change in threshold voltage Vth of the transistor and thus possible to suppress occurrence of an afterimage. Also, it is possible to secure stability of the transistor during operation and thus possible to improve display quality.

The first blocking layer 120 may be made of an opaque conductive material to block light incident from the outside of the display device. For example, the first blocking layer 120 may be a single layer made of any one of molybdenum (Mo), copper (Cu), titanium (Ti), aluminum (Al), chromium (Cr), nickel (Ni), neodymium (Nd), tungsten (W), and gold (Au) or an alloy thereof. In some implementations, the first blocking layer 120 may be a plurality of layers thereof. However, the present disclosure is not limited thereto.

The first blocking layer 120 may contain titanium (Ti) that is stably bonded to hydrogen. Due to a process of forming the semiconductor pattern, permeation of hydrogen remaining between the substrate and an insulating film into the semiconductor pattern can be suppressed by the first blocking layer 120. Therefore, the first blocking layer 120 does not allow the semiconductor pattern to be made conductive. Thus, reliability in operational characteristics of the display device according to an example embodiment of the present disclosure can be improved.

A second buffer layer 111 and a third buffer layer 112 may be disposed on the first blocking layer 120 and on the first buffer layer 110 in the first area AA, the second area NA and the third area EA. The second buffer layer 111 and the third buffer layer 112 may be made of an insulating material such as silicon nitride (SiNx) or silicon oxide (SiOx), or may be made of an inorganic insulating material. However, the present disclosure is not limited thereto.

A first semiconductor pattern 121 of the first transistor 20 and a third semiconductor pattern 171 of the third transistor 70 may be disposed on the second buffer layer 111 and the third buffer layer 112 in the first area AA and the second area NA. The first semiconductor pattern 121 and the third semiconductor pattern 171 may overlap the first blocking layer 120.

The first semiconductor pattern 121 and the third semiconductor pattern 171 may be made of a polycrystalline semiconductor. For example, the polycrystalline semiconductor may be made of low temperature poly-silicon (LTPS) having high mobility. If the first semiconductor pattern 121 and the third semiconductor pattern 171 are made of a polycrystalline semiconductor, they have low energy consumption power and high reliability.

Also, the first semiconductor pattern 121 and the third semiconductor pattern 171 may be made of amorphous silicon (a-Si), or may be made of various organic semiconductor materials, such as pentacene, or various oxides. However, the present disclosure is not limited thereto.

In some implementations, the first semiconductor pattern 121 and the third semiconductor pattern 171 may include a channel region without a doping process. The channel region may be disposed to overlap a first gate electrode 122 and a third gate electrode 172, respectively. A source region and a drain region which are made conductive, e.g., through an ion doping process, may be respectively formed on both sides of the channel region. The source and drain regions may be parts of the first semiconductor pattern 121 and the third semiconductor pattern 171 connected to a first source or drain electrode 123 and a third source or drain electrode 173, respectively.

A first gate insulating film 113 may be disposed on the first semiconductor pattern 121 and the third semiconductor pattern 171. The first gate insulating film 113 is disposed between the first semiconductor pattern 121 and the first gate electrode 122 of the first transistor 20. Also, a gate insulating film, e.g., a same layer of the first gate insulating film 113, is disposed between the third semiconductor pattern 171 and the third gate electrode 172 of the third transistor 70. Therefore, the first semiconductor pattern 121 can be insulated from the first gate electrode 122, and the third semiconductor pattern 171 can be insulated from the third gate electrode 172.

The first gate insulating film 113 may be made of an inorganic insulating material such as silicon nitride (SiNx) or silicon oxide (SiOx), or may be made of an organic insulating material. However, the present disclosure is not limited thereto.

On the first gate insulating film 113, the first gate electrode 122 and the third gate electrode 172 of the first transistor 20 and the third transistor 70 may be disposed. Also, on the first gate insulating film 113, a first storage capacitor electrode 126 of the storage capacitor Cst of the pixel PXL in the first area AA may be disposed.

The first gate electrode 122 may be disposed to overlap the first semiconductor pattern 121, and the third gate electrode 172 may be disposed to overlap the third semiconductor pattern 171.

Each of the first gate electrode 122, the third gate electrode 172 and the first storage capacitor electrode 126 may be a single layer made of any one of silver (Ag), molybdenum (Mo), copper (Cu), titanium (Ti), aluminum (Al), chromium (Cr), nickel (Ni), neodymium (Nd), tungsten (W), and gold (Au) or an alloy thereof. In some implementations, each of the first gate electrode 122, the third gate electrode 172 and the first storage capacitor electrode 126 may be a plurality of layers thereof. However, the present disclosure is not limited thereto.

A first interlayer insulating film 114 may be disposed on the first gate electrode 122, the third gate electrode 172 and the first storage capacitor electrode 126.

A second storage capacitor electrode 127 is disposed on the first interlayer insulating film 114 so as to overlap the first storage capacitor electrode 126. Thus, the storage capacitor Cst is formed.

Also, a lower gate 130 of the second transistor 30 of the pixel PXL in the first area AA may be disposed on the first interlayer insulating film 114. The lower gate 130 is electrically connected to a second gate electrode 140 to drive the second transistor 30.

The second storage capacitor electrode 127 may be formed through the same process as the lower gate 130. Also, the second storage capacitor electrode 127 may be a single layer made of any one of silver (Ag), molybdenum (Mo), copper (Cu), titanium (Ti), aluminum (Al), chromium (Cr), nickel (Ni), neodymium (Nd), tungsten (W), and gold (Au) or an alloy thereof. In some implementations, the second storage capacitor electrode 127 may be a plurality of layers thereof. However, the present disclosure is not limited thereto.

A first insulating filmi 115 may be disposed on the second storage capacitor electrode 127 and the lower gate 130. The first insulating filmi 115 may be made of an insulating material such as silicon nitride (SiNx) or silicon oxide (SiOx), or may be made of an organic insulating material. However, the present disclosure is not limited thereto.

A second semiconductor pattern 131 of a second transistor 30 may be disposed on the first insulating filmi 115. The second semiconductor pattern 131 may be made of a metal oxide. For example, the second semiconductor pattern 131 may be made of any one of indium-gallium-zinc-oxide (IGZO), indium-zinc-oxide (IZO), indium-gallium-tin-oxide (IGTO), and indium-gallium-oxide (IGO). However, the present disclosure is not limited thereto.

The metal oxide material may be improved in conductivity by a doping process of injecting impurities. The second semiconductor pattern 131 may include a channel region where a channel through which mobility of electrons or holes is formed. Also, the channel region may be disposed overlapping the second gate electrode 140. A source region and a drain region which are made conductive may be respectively formed on both sides of the channel region. The source and drain regions may be parts of the second semiconductor pattern 131 connected to a second source or drain electrode 132.

A second gate insulating film 116 may be disposed on the second semiconductor pattern 131. The second gate insulating film 116 may be made of an insulating material such as silicon nitride (SiNx) or silicon oxide (SiOx), or may be made of an inorganic insulating material or an organic insulating material. However, the present disclosure is not limited thereto.

The second gate electrode 140 may be disposed on the second gate insulating film 116 in a region overlapping the channel region of the second semiconductor pattern 131.

A second interlayer insulating film 117 may be disposed on the second gate electrode 140. The second interlayer insulating film 117 may be made of an insulating material such as silicon nitride (SiNx) or silicon oxide (SiOx), or may be made of an inorganic insulating material or an organic insulating material. However, the present disclosure is not limited thereto.

The first source or drain electrode 123, the second source or drain electrode 132, and the third source or drain electrode 173 serving as source or drain electrodes of the first transistor 20, the second transistor 30 and the third transistor 70, respectively, may be disposed on the second interlayer insulating film 117. The first source or drain electrode 123 and the third source or drain electrode 173 may be connected to the first semiconductor pattern 121 and the third semiconductor pattern 171, respectively, through contact holes. The contact holes are formed in the second interlayer insulating film 117, the second gate insulating film 116, the first insulating filmi 115, the first interlayer insulating film 114, and the first gate insulating film 113.

The second source or drain electrode 132 may be connected to the second semiconductor pattern 131 through contact holes formed in the second interlayer insulating film 117 and the second gate insulating film 116.

The first blocking layer 120 may be connected to the first source or drain electrode 123, and a second blocking layer 170 may be connected to the second source or drain electrode 132. The first blocking layer 120 and the second blocking layer 170 may be connected to the first source or drain electrode 123 and the second source or drain electrode 132, respectively. In this case, the first semiconductor pattern 121 and the second semiconductor pattern 132 block light and also accumulate parasitic carriers. Therefore, it is possible to suppress a sharp increase in drain current or a change in threshold voltage caused by a drain voltage.

The second blocking layer 170 may be connected to the second source or drain electrode 132. However, the second blocking layer 170 may not be connected to the second source or drain electrode 132. This is because the transistor of the gate driver is greater in size than the transistor of the pixel of the driving pixel, and, thus, there is a small change in driving of the semiconductor layer caused by a size ratio.

A first planarization layer 118 and a second planarization layer 119 may be disposed on the first source or drain electrode 123, the second source or drain electrode 132, and the third source or drain electrode 173. A first connection electrode 125 may be disposed between the first planarization layer 118 and the second planarization layer 119.

An anode 150 may be disposed on the second planarization layer 119. The anode 150 may be connected to the first connection electrode 125 through a hole formed in the second planarization layer 119.

A hole may be formed in the first planarization layer 118, and the first connection electrode 125 may be disposed inside the hole. Thus, the first transistor 20 may be electrically connected to the anode 150 through the first connection electrode 125.

The anode 150 may supply holes into a light-emitting diode layer 153 and may be made of a conductive material having a high work function.

If the display device 10 is of a top emission type, the anode 150 may serve as a reflective electrode that reflects light and may be made of an opaque conductive material. For example, the anode 150 may be made of at least one of silver (Ag), aluminum (Al), gold (Au), molybdenum (Mo), tungsten (W), chromium (Cr), or an alloy thereof. However, the present disclosure is not limited thereto. For example, the anode 150 may have a triple-layer structure of silver (Ag)/lead (Pd)/copper (Cu), but is not limited thereto.

If the display device 10 is of a bottom emission type, the anode 150 may be made of a transparent conductive material that transmits light. For example, the anode 150 may be made of at least one of indium tin oxide (ITO) and indium zinc oxide (IZO). However, the present disclosure is not limited thereto.

A bank 151 may be disposed on the anode 150 and the second planarization layer 119.

The bank 151 may separate a plurality of sub-pixels SP, minimize light spread and suppress color mixing which occur at various viewing angles.

The bank 151 may expose the anode 150 corresponding to an emission area and may overlap an edge portion of the anode 150.

Also, the bank 151 may overlap a hole formed in the first planarization layer 118 and a hole formed in the second planarization layer 119.

The bank 151 may be made of at least one of inorganic insulating materials such as silicon nitride (SiNx) or silicon oxide (SiOx) or organic insulating materials such as benzocyclobutene (BCB), acryl resin, epoxy resin, phenolic resin, polyamide resin or polyimide resin. However, the present disclosure is not limited thereto.

A spacer 152 may be further disposed on the bank 151. The spacer 152 may serve to buffer an empty space between the substrate 100 on which the light-emitting diode layer 153 is formed and an upper substrate to minimize damage to the display device 10 caused by an external impact. The spacer 152 may be made of the same material as the bank 151, and may be formed at the same time as the bank 151. However, the present disclosure is not limited thereto.

The light-emitting diode layer 153 may be disposed on the anode 150, the bank 151, and in some implementations on the spacer 152. In some implementations, the light-emitting diode layer 153 may be disposed adjacent to the bank 151 and spaced apart from the spacer 152, as shown in FIG. 3. In some implementations, the light-emitting diode layer 153 or emission layer 153 may include at least one of a red emission layer, a green emission layer, a blue emission layer and a white emission layer to emit light of a specific color. In some implementations, the light-emitting diode layer 153 includes a white organic emission layer, and a color filter configured to convert white light emitted from the white organic emission layer into light of a different color may be disposed on the light-emitting diode layer 153. The light-emitting diode layer 153 may further include a hole injection layer, a hole transport layer, an electron transport layer, and an electron injection layer in addition to the organic emission layer. However, the present disclosure is not limited thereto.

A cathode 154 may be disposed on the light-emitting diode layer 153. The cathode 154 may supply electrons into the light-emitting diode layer 153 and may be made of a conductive material having a low work function.

If the display device 10 is of a top emission type, the cathode 154 may be made of a transparent conductive material that transmits light. For example, the cathode 154 may be made of at least one of indium tin oxide (ITO) and indium zinc oxide (IZO). However, the present disclosure is not limited thereto.

Also, the cathode 154 may be made of a translucent conductive material that transmits light. For example, the cathode 154 may be made of at least one of alloys such as LiF/Al, CsF/Al, Mg:Ag, Ca/Ag, Ca:Ag, LiF/Mg:Ag, LiF/Ca/Ag, and LiF/Ca:Ag. However, the present disclosure is not limited thereto.

If the display device 10 is of a bottom emission type, the cathode 154 may serve as a reflective electrode that reflects light and may be made of an opaque conductive material. For example, the cathode 154 may be made of at least one of silver (Ag), aluminum (Al), gold (Au), molybdenum (Mo), tungsten (W), chromium (Cr), or an alloy thereof.

A capping layer 155 may be disposed on the cathode 154. The capping layer 155 may be formed by an organic film or an inorganic film that protects the cathode 154 and improves the external light efficiency. The capping layer 155 may be formed by an inorganic film using a metal material such as LiF, and may further include an organic film. However, the present disclosure is not limited thereto. For example, the capping layer 155 may have a structure in which an organic film and an inorganic film are laminated, and the organic film may have a different thickness from the inorganic film. For example, the organic film may have a greater thickness than the inorganic film. For another example, the capping layer 155 may be configured by laminating materials having different refractive indexes into at least two layers.

An encapsulation layer 160 may be disposed on the capping layer 155. The encapsulation layer 160 may protect the display device 10 against external moisture, oxygen or foreign matters. For example, the encapsulation layer 160 may suppress permeation of oxygen and moisture from the outside to suppress oxidation of a light-emitting material and an electrode material.

The encapsulation layer 160 may be made of a transparent material to transmit light emitted from the light-emitting diode layer 153.

The encapsulation layer 160 may include a first encapsulation layer 161, a second encapsulation layer 162 and a third encapsulation layer 163 that blocks permeation of moisture or oxygen. However, the present disclosure is not limited thereto. The first encapsulation layer 161, the second encapsulation layer 162 and the third encapsulation layer 163 may be laminated alternately. However, the present disclosure is not limited thereto.

The first encapsulation layer 161 and the third encapsulation layer 163 may be made of at least one inorganic material of silicon nitride (SiNx), silicon oxide (SiOx) or aluminum oxide (AlyOz), but are not limited thereto.

The second encapsulation layer 162 may cover foreign matters or particles which may be generated in the manufacturing process. Also, the second encapsulation layer 162 may planarize a surface of the first encapsulation layer 161.

The second encapsulation layer 162 may be made of an organic material, such as silicon oxycarbon (SiOCz), epoxy, polyimide, polyethylene and acrylate-based polymer, but is not limited thereto.

The third area EA, which is the edge portion of the display device 10, may be an area for sealing the display device using an electrical connector between the cathode and an EVSS line, the encapsulation layer and a plurality of dams.

The first buffer layer 110, the second buffer layer 111, and the third buffer layer 112 disposed on the substrate 100 in the first area AA and the second area NA may extend to the third area EA. Also, the first gate insulating film 113, the first interlayer insulating film 114, and the first insulating filmi 115 disposed on the substrate 100 in the first area AA and the second area NA may extend to the third area EA. Further, the second gate insulating film 116 and the second interlayer insulating film 117 disposed on the substrate 100 in the first area AA and the second area NA may extend to the third area EA.

Lines may be disposed in the third area EA so that power voltages and touch signals applied from the FPCB of the display device 10 are connected through the lines.

A first line 191 may be disposed on the second interlayer insulating film 117 in the third area EA.

The first line 191 may be formed through the same process as the first source or drain electrode 123. However, the present disclosure is not limited thereto.

The first line 191 may be a single layer made of any one of molybdenum (Mo), copper (Cu), titanium (Ti), aluminum (Al), chromium (Cr), gold (Au), nickel (Ni), and neodymium (Nd) or an alloy thereof. In some implementations, the first line 191 may be a plurality of layers thereof, and may have a triple-layer structure of titanium (Ti)/aluminum (Al)/titanium (Ti). However, the present disclosure is not limited thereto.

The third area EA may include a dam unit 180 where a plurality of dams is located.

The dam unit 180 may include at least one dam.

In the present disclosure, the dam unit 180 is illustrated as including a first dam 181, a second dam 182, and a third dam 183, but is not limited thereto.

The first dam 181, the second dam 182, and the third dam 183 may be formed by laminating at least one insulating layer to suppress leakage of the second encapsulation layer 162 formed by an organic film to the outside of the third area EA. However, the present disclosure is not limited thereto.

The first dam 181, the second dam 182, and the third dam 183 may have a first height, a second height, and a third height, respectively, and may surround the first area AA and the second area NA.

The second height may be greater than the first height and the third height. Thus, even when the second encapsulation layer 162 flows over the first dam 181, the second dam 182 can suppress leakage of the second encapsulation layer 162 to the outside.

Each of the first dam 181 and the third dam 183 may be composed of the bank 151 and the spacer 152. The second dam 182 may be composed of the first planarization layer 118, the second planarization layer 119 the bank 151, and the spacer 152.

The first line 191 may extend to a bottom side of the first dam 181 and the second dam 182.

The first planarization layer 118 and the second planarization layer 119 may be disposed on the first line 191 in the third area EA.

A second line 192 may be disposed on the first planarization layer 118 and the second planarization layer 119. The second line 192 may extend along one side end of the first planarization layer 118 and the second planarization layer 119 to a bottom side of the first dam 181.

The first dam 181 may be connected to the first line 191 disposed on the second interlayer insulating film 117 in an area where the first planarization layer 118 and the second planarization layer 119 are not disposed.

The second line 192 may be formed through the same process as the anode 150. However, the present disclosure is not limited thereto.

The bank 151 may be disposed on the second line 192. The bank 151 on the second line 192 in the third area EA may include at least one hole that exposes the second line 192.

The cathode 154 on the bank 151 may be disposed in the first area AA, the second area NA, and the third area EA.

The cathode 154 may be connected to the second line 192 through the at least one hole that is formed in the bank 151 and exposes the second line 192.

An EVSS power voltage applied through the FPCB may be transferred to the cathode 154 through the first line 191 and the second line 192.

The capping layer 155 may be disposed on the cathode 154 in the third area EA, and the encapsulation layer 160 may be disposed on the capping layer 155.

The first encapsulation layer 161 and the third encapsulation layer 163 of the encapsulation layer 160 may pass through the dam unit 180 and may be disposed on the substrate 100. For example, the first encapsulation layer 161 and the third encapsulation layer 163 of the encapsulation layer 160 may pass through the dam unit 180 and may be directly disposed on the substrate 100.

The second encapsulation layer 162 may extend to a part of the dam unit 180. Thus, the first encapsulation layer 161 may be in contact with the third encapsulation layer 163 in the third area EA where the second encapsulation layer 162 is not disposed.

If the second semiconductor pattern 131 of the second transistor 30 in the first area AA is made of an oxide semiconductor, hydrogen may permeate into the channel region of the second semiconductor pattern 131 through the upper insulating films.

The channel region of the oxide semiconductor may be made conductive by the permeation of hydrogen. Therefore, characteristics of elements of the oxide semiconductor may be degraded.

According to the present disclosure, the characteristics of the elements of the oxide semiconductor may be improved by forming a gate electrode including a hydrogen blocking layer. The gate electrode may be composed of at least two metal layers including a metal layer for blocking permeation of hydrogen and a metal layer having a low resistance. However, the present disclosure is not limited thereto.

FIG. 4A through FIG. 4D are cross-sectional views illustrating how a transistor according to an embodiment of the present disclosure is formed.

Figure 4A:
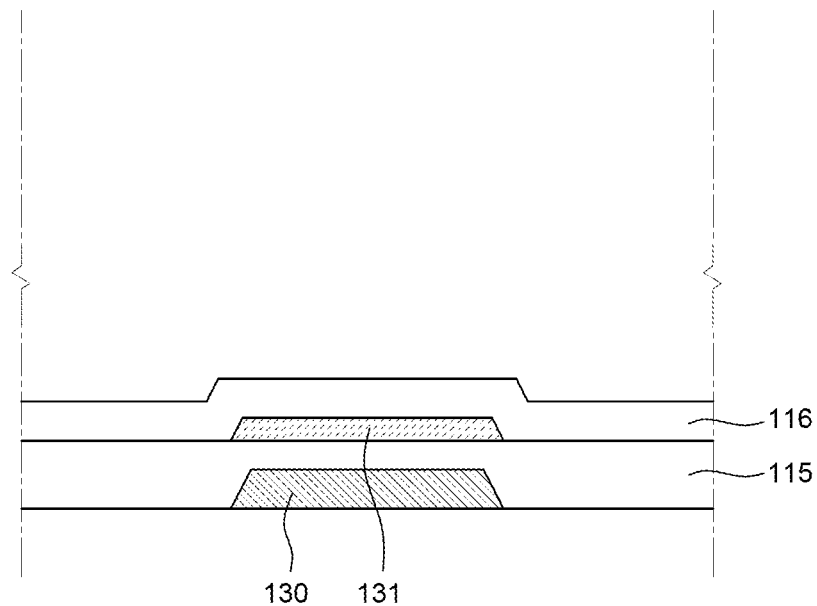
FIG. 4A through FIG. 4D are cross-sectional views illustrating how a transistor including an oxide semiconductor of a light-emitting display device according to an embodiment of the present disclosure is fabricated.
Figure 4B:
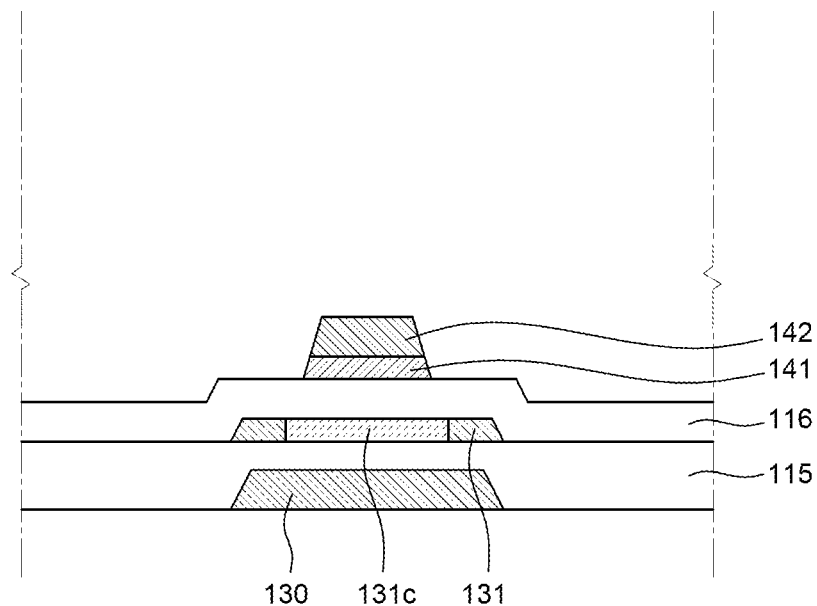
Figure 4C:
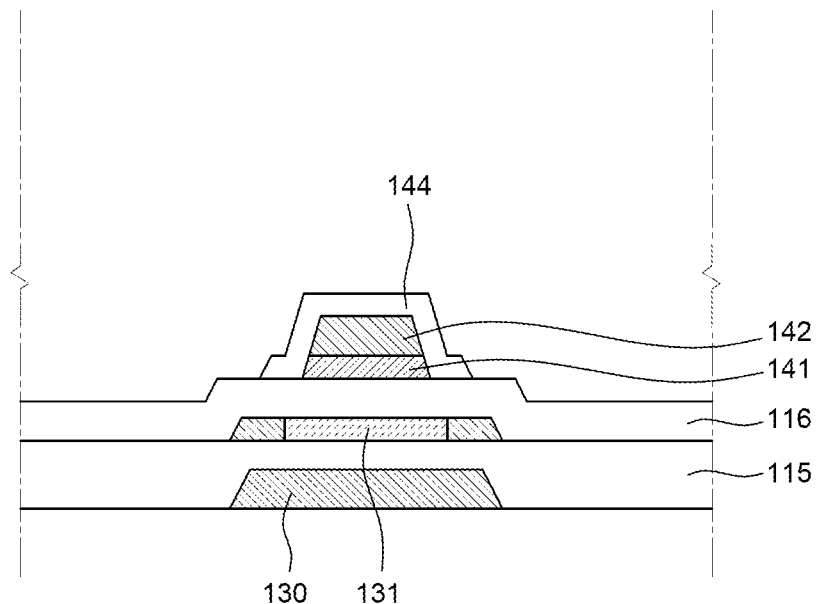

Referring to FIG. 4A and FIG. 4B, the second semiconductor pattern 131 of the second transistor 30 is formed, and the second gate insulating film 116 is formed.

A first electrode 141 and a second electrode 142 may be formed on the second gate insulating film 116, followed by a patterning process.

The first electrode 141 and the second electrode 142 may overlap the channel region 131c of the second semiconductor pattern 131.

As shown in FIG. 4B, in the display device according to an embodiment of the present disclosure, a region connected to the source and drain regions of the second semiconductor pattern 131 is made conductive by using the first electrode 141 and the second electrode 142. Thus, the region can have a lower resistance than the channel region.

The process in which the region connected to the source and drain regions of the second semiconductor pattern 131 is made conductive may include a process of doping the region with hydrogen H. For example, the process of forming the second semiconductor pattern 131 may include a process of forming the first electrode 141 and the second electrode 142 and then exposing them to plasma.

The channel region of the second semiconductor pattern 131 that overlaps the first electrode 141 made of a material for suppressing permeation of hydrogen into a semiconductor layer may not be doped with hydrogen.

The first electrode 141 for blocking hydrogen may be made of a titanium (Ti)-containing material such as titanium nitride (TiN), titanium carbide (TiC), aluminum nitride (AlN), and titanium aluminum nitride (TiAlN). However, the present disclosure is not limited thereto.

The second electrode 142 may be a single layer made of any one of molybdenum (Mo), copper (Cu), titanium (Ti), aluminum (Al), chromium (Cr), gold (Au), nickel (Ni), and neodymium (Nd) or an alloy thereof. In some implementations, the second electrode 142 may be a plurality of layers thereof. However, the present disclosure is not limited thereto.

After the first electrode 141 and the second electrode 142 are formed, a protective film 144 is formed on an upper surface 141u, 142u and side surfaces 141s, 142s of the first electrode 141 and the second electrode 142. The protective film 144 is in contact with the upper surface 142u and two side surfaces 142s of the second electrode 142. The protective film 144 is made of silicon oxide (SiOx). In some implementations, the protection film may be formed only on the upper surface and side surfaces of the first electrode 141 and the second electrode 142. In some implementations, the protective film 144 may also be formed on the second gate insulating film 116.

A third electrode 143 is formed on the protective film 144. The third electrode 143 is formed on the protective film 144 over the upper surface and side surfaces of the first electrode 141 and the second electrode 142. In some implementations, the third electrode 143 and the protective film 144 over the upper surface 141u, 142u and two side surfaces 141s, 142s of each of the first electrode 141 and the second electrode 142. The third electrode 143 may be made of a material containing titanium (Ti) that suppresses permeation of hydrogen, such as titanium nitride (TiN), titanium carbide (TiC), aluminum nitride (AlN), and titanium aluminum nitride (TiAlN). However, the present disclosure is not limited thereto.

Figure 4D:
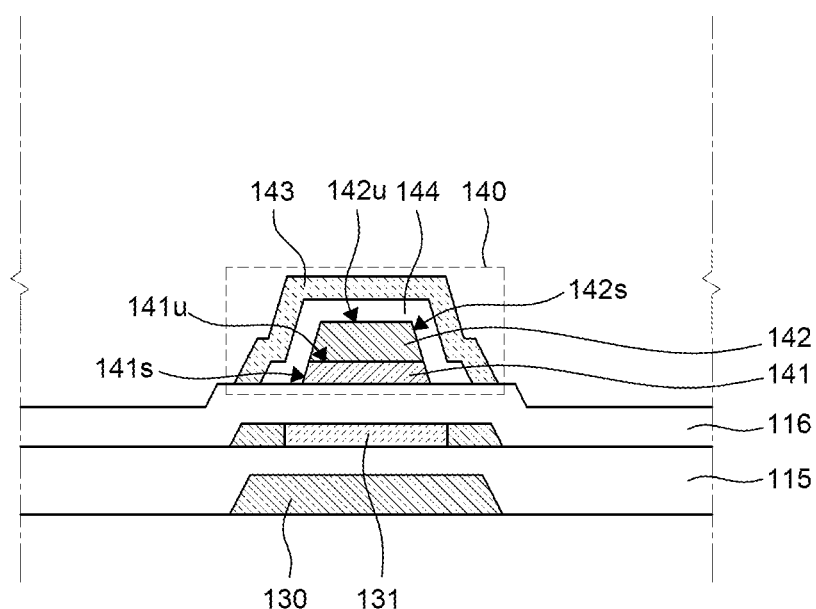

In some implementations, the protection film 144 is omitted, and the third electrode 143 is firmed on and in contact with the upper surface 142s of the second electrode 142 and side surfaces 142s, 141s of the second electrode 142 and the first electrode 141. In some implementations, the protection film 144 is formed as shown in FIG. 4D and is then recesses to form an undercut area which exposes at least a portion of side surface 141s of the first electrode 141, and the third electrode 143 is formed in contact with the side surfaces 141s through the undercut area According to an embodiment of the present disclosure, the second gate electrode 140 may be composed of the first electrode 141, the second electrode 142, the protective film 144, and the third electrode 143. The first electrode 141, the second electrode 142, the protective film 144, and the third electrode 143 are formed overlapping the channel region of the second semiconductor pattern 131.

Figure 5:
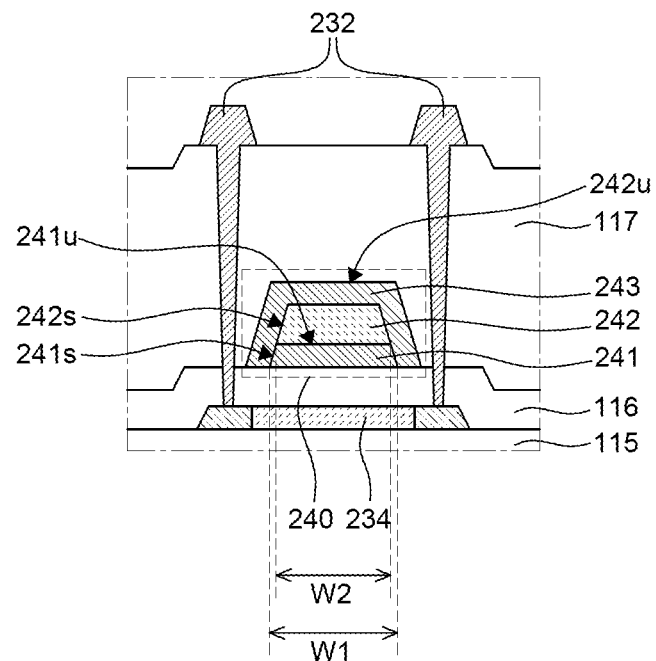
FIG. 5 is a cross-sectional view illustrating an oxide semiconductor transistor according to another embodiment of the present disclosure.

FIG. 5 is a cross-sectional view illustrating a second transistor according to an embodiment of the present disclosure.

In explaining the display device according to the present embodiment of the present disclosure, detailed description of components identical or corresponding to those of the above-described embodiment will be omitted or briefly provided.

A first electrode 241 and a second electrode 242 may be formed on the second gate insulating film 116, followed by a patterning process.

The first electrode 241 may be made of a material containing titanium (Ti) that suppresses permeation of hydrogen. For example, the first electrode 241 may be made of titanium nitride (TiN), titanium carbide (TiC), aluminum nitride (AlN), and titanium aluminum nitride (TiAlN). However, the present disclosure is not limited thereto.

The second electrode 242 may be a single layer made of any one of molybdenum (Mo), copper (Cu), titanium (Ti), aluminum (Al), chromium (Cr), gold (Au), nickel (Ni), and neodymium (Nd) or an alloy thereof. In some implementations, the second electrode 242 may be a plurality of layers thereof. However, the present disclosure is not limited thereto.

The first electrode 241 may be formed to have a width W1 different from a width W2 of the second electrode 242. For example, the first electrode 241 may be formed to have a greater width than the second electrode 242.

A third electrode 243 is formed on at least one of an upper surface 241u, 242u and side surfaces 241s, 242s of the first electrode 241 and the second electrode 242. The third electrode 243 is formed in contact with at least one of the upper surface 242u of the second electrode 242 and the side surfaces 242s of the second electrode 242. In some implementations, the third electrode 243 is formed in contact with the upper surface 242u of the second electrode 242 and the two or more side surfaces 241s, 242s of each of the first electrode 241 and the second electrode 242.

The third electrode 243 may be made of a material containing titanium (Ti) that suppresses permeation of hydrogen. For example, the third electrode 243 may be made of titanium nitride (TiN), titanium carbide (TiC), aluminum nitride (AlN), and titanium aluminum nitride (TiAlN). However, the present disclosure is not limited thereto.

The third electrode 243 may be formed to have a greater width than the side surfaces of the first electrode 241 and the first electrode 241. Also, the third electrode 243 may be connected to the upper surface of the second electrode 242 that does not overlap the first electrode 241. Further, the third electrode 243 may be connected to the upper surface and side surfaces of the second electrode 242.

Figure 6:
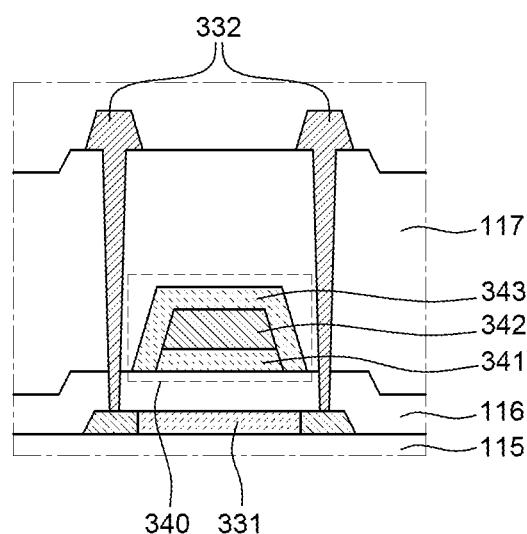
FIG. 6 is a cross-sectional view illustrating an oxide semiconductor transistor according to yet another embodiment of the present disclosure.

FIG. 6 is a cross-sectional view illustrating a second transistor according to an embodiment of the present disclosure.

In explaining the display device according to the present embodiment of the present disclosure, detailed description of components identical or corresponding to those of the above-described embodiments will be omitted or briefly provided.

A first electrode 341 and a second electrode 342 may be formed on the second gate insulating film 116, followed by a patterning process.

The first electrode 341 may be a single layer made of any one of molybdenum (Mo), copper (Cu), titanium (Ti), aluminum (Al), chromium (Cr), gold (Au), nickel (Ni), and neodymium (Nd) or an alloy thereof. In some implementations, the first electrode 341 may be a plurality of layers thereof. However, the present disclosure is not limited thereto.

The second electrode 342 may be made of a material containing titanium (Ti) that suppresses permeation of hydrogen. For example, the second electrode 342 may be made of titanium nitride (TiN), titanium carbide (TiC), aluminum nitride (AlN), and titanium aluminum nitride (TiAlN). However, the present disclosure is not limited thereto.

The first electrode 341 may be formed to have a different width from the second electrode 342. For example, the first electrode 341 may be formed to have a greater width than the second electrode 342.

A third electrode 343 is formed on an upper surface and side surfaces of the first electrode 341 and the second electrode 342.

The third electrode 343 may be a single layer made of any one of molybdenum (Mo), copper (Cu), titanium (Ti), aluminum (Al), chromium (Cr), gold (Au), nickel (Ni), and neodymium (Nd) or an alloy thereof. In some implementations, the third electrode 343 may be a plurality of layers thereof. However, the present disclosure is not limited thereto.

The third electrode 343 may be formed to have a greater width than the side surfaces of the first electrode 341 and the first electrode 341. Also, the third electrode 343 may be connected to the upper surface of the second electrode 342 that does not overlap the first electrode 341. Further, third electrode 343 may be connected to the upper surface and side surfaces of the second electrode 342.

Although the example embodiments of the present disclosure have been described in detail with reference to the accompanying drawings, the present disclosure is not limited thereto and may be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. All the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a first flexible substrate;
a second flexible substrate including a first area, a second area, and a third area;
an intermediate layer between the first flexible substrate and the second flexible substrate,
a plurality of pixels being disposed in the first area;
a first transistor and a second transistor disposed in the first area, the first transistor including a polycrystalline semiconductor and a first gate electrode, the second transistor including an oxide semiconductor and a second gate electrode that includes a first metal layer, a second metal layer, and a third metal layer;
a third transistor including the polycrystalline semiconductor and disposed in the second area, and
one or more dams, a first line, and a second line disposed in the third area, and
a cathode that extends among the first area, the second area, and the third area.

2. The display device according to claim 1, further comprising:
a first buffer layer on the second flexible substrate;
a first blocking layer between the first transistor and the first buffer layer; and
a second blocking layer between the third transistor and the first buffer layer.

3. The display device according to claim 2, wherein the first blocking layer is connected to a source or a drain electrode of the first transistor, and
the second blocking layer is connected to a source or a drain electrode of the third transistor.

4. The display device according to claim 1, comprising capacitor disposed in the first area, the capacitor including a first capacitor electrode and a second capacitor electrode.

5. The display device according to claim 4, wherein the first capacitor electrode is on a same layer as the first gate electrode of the first transistor.

6. The display device according to claim 4, wherein the second transistor further includes a lower gate, and the second capacitor electrode is on a same layer as the lower gate.

7. The display device according to claim 1, wherein the first transistor includes a first source electrode and a first drain electrode, the second transistor includes a second source electrode and a second drain electrode, the third transistor includes a third source electrode and a third drain electrode, the first source and drain electrodes, the second source and drain electrodes, and the third source and drain electrodes are on a same layer.

8. The display device according to claim 7, further comprising:
a first planarization layer on the first, second and third transistors;
a second planarization layer on the first planarization layer;
an anode between the first planarization layer and the second planarization layer; and
a connection structure connecting the first transistor and the anode.

9. The display device according to claim 8, further comprising:
a bank and a spacer on the anode.

10. The display device according to claim 9, further comprising:
an emission layer adjacent to the bank,
wherein the emission layer is spaced apart from the spacer.

11. The display device according to claim 9, wherein the one or more dams in the third area each include portions that are in a same layer as at least two of the first planarization layer, the second planarization layer, the bank, and the spacer, respectively.

12. The display device according to claim 11, wherein the first line and the second line are disposed under at least one of the one or more dams.

13. The display device according to claim 11, wherein the first line is connected to the second line at a first connection location, the second line is connected to the cathode at a second connection location, and the first connection location is different from the second connection location.

14. The display device according to claim 1, further comprising a protective film,
wherein:
the first metal layer of the second gate electrode is under the second metal layer,
the third metal layer is on the second metal layer, and
the protective film is between the second metal layer and the third metal layer.

15. The display device according to claim 14, wherein the protective film is in contact with at least one of an upper surface and a side surface of the second metal layer.

16. The display device according to claim 14, wherein the protective film includes silicon oxide.

17. The display device according to claim 1, wherein the first metal layer of the second gate electrode is under the second metal layer, and
the third metal layer is in contact with at least one of an upper surface and a side surface of the second metal layer.

18. The display device according to claim 1, wherein the first metal layer of the second gate electrode has a greater width than that of the second metal layer, and
the third metal layer is in contact with two side surfaces of the first metal layer.

19. The display device according to claim 1, wherein at least one of the first metal layer, the second metal layer, and the third metal layer of the second gate electrode is made of at least one of TiN, TiC, AN, or TiAlN.

20. The display device according to claim 1, further comprising:
a plurality of encapsulation layers on the cathode, the plurality of encapsulation layers including at least two encapsulation layers disposed on the one or more dams.

21. A display device, comprising:
a flexible substrate including a first area, a second area, and a third area;
a plurality of pixels disposed in the first area;
a first transistor and a second transistor disposed in the first area, the first transistor including a polycrystalline semiconductor and a first gate electrode, the second transistor including an oxide semiconductor and a second gate electrode that includes a first metal layer, a second metal layer, and a third metal layer;
a third transistor including the polycrystalline semiconductor and disposed in the second area,
wherein the polycrystalline semiconductor of the first transistor and the polycrystalline semiconductor of the third transistor are on a same layer, and the oxide semiconductor of the second transistor is on a layer different from the polycrystalline semiconductor of the first transistor.

22. The display device of claim 21, wherein the first transistor includes a first source or drain electrode, the second transistor includes a second source or drain electrode, and the third transistor includes a third source or drain electrode, and
wherein the first source or drain electrode, the second source or drain electrode, and the third source or drain electrode are on a same layer.

23. The display device of claim 21, wherein the second metal layer is on the first metal layer, and the third metal layer is on the second metal layer and adjacent to a sidewall surface of the second metal layer and a sidewall surface of the first metal layer from a lateral direction.

* * * * *